United States Patent
Lin

(10) Patent No.: US 10,474,782 B1
(45) Date of Patent: Nov. 12, 2019

(54) LAYOUT PLACEMENT MAPPING FROM SCHEMATIC PLACEMENT OF CIRCUIT CELLS

(71) Applicant: Cadence Design Systems, Inc., San Jose, CA (US)

(72) Inventor: Kuoching Lin, Cupertino, CA (US)

(73) Assignee: CADENCE DESIGN SYSTEMS, INC., San Jose, CA (US)

(*) Notice: Subject to any disclaimer, the term of this patent is extended or adjusted under 35 U.S.C. 154(b) by 31 days.

(21) Appl. No.: 15/690,875

(22) Filed: Aug. 30, 2017

(51) Int. Cl.
*G06F 17/50* (2006.01)
*H01L 27/02* (2006.01)

(52) U.S. Cl.
CPC ...... *G06F 17/5072* (2013.01); *G06F 17/5077* (2013.01); *H01L 27/0207* (2013.01)

(58) Field of Classification Search
CPC ............. G06F 17/5072; G06F 17/5077; H01L 27/0207
See application file for complete search history.

(56) References Cited

U.S. PATENT DOCUMENTS

| | | | | |
|---|---|---|---|---|
| 6,077,309 | A | 6/2000 | Lin | |
| 6,349,402 | B1 | 2/2002 | Lin | |
| 6,553,554 | B1* | 4/2003 | Dahl | G06F 17/5068 716/119 |
| 6,684,376 | B1* | 1/2004 | Kerzman | G06F 17/5072 716/124 |
| 7,096,444 | B2 | 8/2006 | Lin | |
| 7,392,494 | B2 | 6/2008 | Lin et al. | |
| 7,607,117 | B2 | 10/2009 | Lin | |
| 7,747,973 | B2 | 6/2010 | Lin et al. | |
| 2006/0190889 | A1* | 8/2006 | Cong | G06F 17/5072 716/122 |
| 2011/0258588 | A1* | 10/2011 | Sharma | G06F 17/5072 716/108 |

* cited by examiner

*Primary Examiner* — Vuthe Siek
(74) *Attorney, Agent, or Firm* — Foley & Lardner LLP

(57) ABSTRACT

The present embodiments relate to implementing an integrated circuit design where a layout of circuit cells on a semiconductor chip is based on positions of the circuit cells on a schematic. According to some aspects, embodiments relate to a method for identifying a plurality of sub-regions on a semiconductor chip layout where each sub-region has a placement constraint. The method further includes assigning circuit cells to sub-regions based on the constraints. The method also includes clustering the circuit cells into clusters based on their positions on the schematic. Circuit cells from each cluster are placed in one or more of the sub-regions based on the proximity of the centers of the clusters to the centers of the sub-regions.

20 Claims, 10 Drawing Sheets

US 10,474,782 B1

LAYOUT PLACEMENT MAPPING FROM SCHEMATIC PLACEMENT OF CIRCUIT CELLS

TECHNICAL FIELD

The present disclosure relates generally to integrated circuits, and more particularly to methods and apparatuses for implementing designs of integrated circuits in processes that include design rules.

BACKGROUND

Electronic design automation (EDA) tools are used to design integrated circuits. Integrated circuits can include many thousands and perhaps millions of circuit elements (e.g., transistors, logic gates, diodes) and interconnecting wires and busses. The circuit elements and wires can be formed on many different layers, with various interconnections (e.g., vias) between layers. EDA tools allow a designer to describe an integrated circuit based on its desired behavior, and then transform that behavioral description into a set of geometric shapes called a layout which forms the circuit elements and wires for all the different layers.

SUMMARY

Embodiments according to the present disclosure relate to implementing an integrated circuit design where a layout of circuit cells on a semiconductor chip is based on positions of the circuit cells on a schematic. According to some aspects, embodiments relate to a method that can dynamically identify a plurality of sub-regions on a semiconductor chip layout, where each sub-region has a placement constraint. The method may further include assigning circuit cells to sub-regions based on the constraints. The method may also include clustering the circuit cells into clusters based on their positions on the schematic. Circuit cells from each cluster can be placed in one or more of the sub-regions based on the proximity of the centers of the clusters to the centers of the sub-regions.

BRIEF DESCRIPTION OF THE DRAWINGS

These and other aspects and features of the present embodiments will become apparent to those ordinarily skilled in the art upon review of the following description of specific embodiments in conjunction with the accompanying figures, wherein.

DETAILED DESCRIPTION

Figure 1:
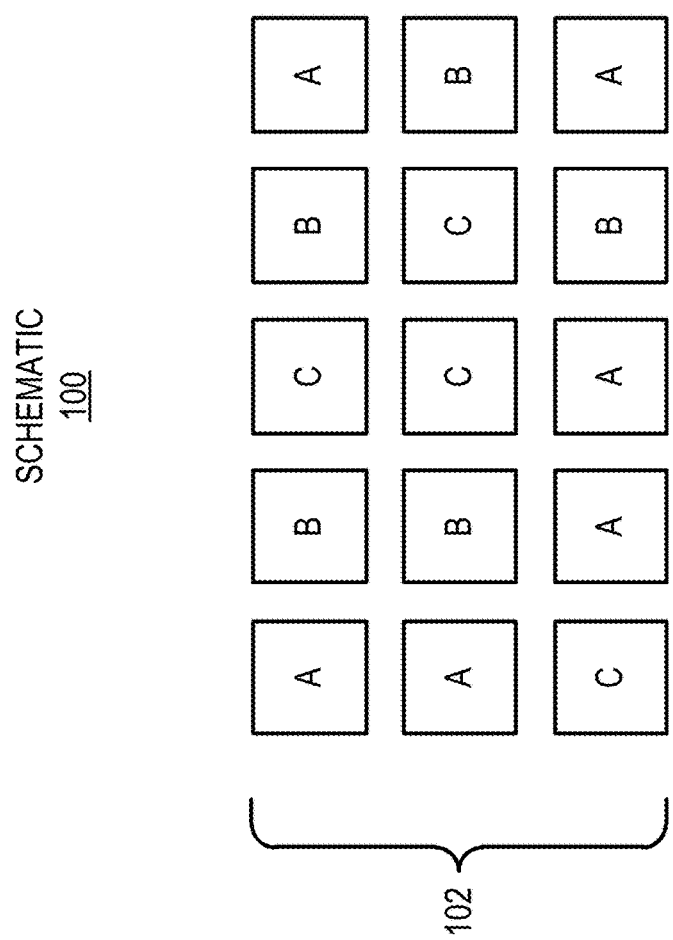
FIG. 1 illustrates a representation of an example schematic in connection with an integrated circuit design.

The present embodiments will now be described in detail with reference to the drawings, which are provided as illustrative examples of the embodiments so as to enable those skilled in the art to practice the embodiments and alternatives apparent to those skilled in the art. Notably, the figures and examples below are not meant to limit the scope of the present embodiments to a single embodiment, but other embodiments are possible by way of interchange of some or all of the described or illustrated elements. Moreover, where certain elements of the present embodiments can be partially or fully implemented using known components, only those portions of such known components that are necessary for an understanding of the present embodiments will be described, and detailed descriptions of other portions of such known components will be omitted so as not to obscure the present embodiments. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the present disclosure is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present embodiments encompass present and future known equivalents to the known components referred to herein by way of illustration.

A schematic can be an arrangement of circuit symbols or circuit cells that describe an integrated circuit. An EDA tool can provide a schematic editor, using which a circuit designer can design a circuit using circuit cells that represent circuit elements. The circuit cells can be selected from a library of circuit cells used by or provided by the EDA tools. The circuit designer can place the selected circuit cells in the schematic in a desired arrangement to design the circuit. The circuit cells also can be interconnected using symbols that represent wires or interconnects. The interconnects can be used, for example, to connect output ports to input ports of circuit cells. An EDA tool can use automated placement or floor-planning tools to place circuits corresponding to the circuit cells in the schematic on a layout, which represents a surface of a chip. However, in some implementations, the use of the automated placement and floor-planning tools can result in congested or overlapped circuit cell placement on the layout. Congested or overlapping circuit cell placement can adversely impact routing of interconnects between the circuit cells, and may affect the reliability of the circuit. In some other instances, where the circuit includes a large number of circuit cells, the placement or floor-planning tools may take a long time to converge to a placement solution, or may provide a placement solution that may not be desired or optimal according to specific constraints.

According to certain general aspects, embodiments relate to techniques including an automated process that use relative positions of circuit cells as they appear on a schematic to guide placement of those circuit cells on a layout. By providing the initial placement of the circuit cells on the layout based on their relative positions on the schematic, the EDA tool is provided a good starting point from which further legalization and optimization of the placement of the circuit cells can be carried out. This can reduce the risk of congested placement of circuit cells and can reduce the time taken by the EDA tool to converge to a placement solution.

FIG. 1 illustrates a representation of an example schematic 100. The schematic 100 includes several circuit cells 102 that form a desired circuit. The circuit cells 102 can be placed manually by a circuit designer or automatically by a EDA tool. For example, a circuit designer can use a graphical user interface (GUI) to pick and place circuit cells from a circuit cell library provided by a schematic editor. Alternatively, an automated EDA tool can automatically place circuit cells on the schematic based on a circuit description provided by the circuit designer. Each circuit cell can represent a sub-circuit that forms a constituent portion of the overall circuit. For example, the circuit cells 102 can include digital and/or analog circuits, such as, for example, logic gates, flip-flops, amplifiers, current mirrors, diodes, transistors. The circuit cell library provided by the schematic editor can include hundreds of circuit cells that can be selected for placement on the schematic.

In some implementations, the circuit cells can include standard cells. Standard cells can be pre-defined circuit blocks that provide a particular function. For example, standard cells can be provided for NAND, NOR, NOT gates. However, in some implementations, the standard cells can provide complex functions such as memory, digital-to-analog converters, processors, amplifiers, filters, and the like. In some implementations, the circuit cells may also include proprietary cores, which can be supplied by a vendor and provided to the designer by the schematic editor. Each standard cell can include a corresponding layout, which represents a physical design of the standard cell as it would appear on a chip. For example, the layout can include polygonal shapes representing regions of various types of materials, such as p-type materials, n-type materials, a first metal, and a second metal. The layout can have a close correspondence to one or more masks used for fabrication of the chip.

In some implementations, multiple circuit cells 102 can be instances of the same circuit cell. For example, two or more of the circuit cells 102 can be instances of a NAND gate standard cell. In some implementations, the circuit cells 102 can have a particular type. For example, the types can be based on the semiconductor material such as n-type or p-type used to form the constituent elements of the circuit cell. In another example, the type can be based on the size of the circuit cells. In yet another example, the type can be based on the locations of the input/output (I/O) terminals of the circuit cells. In some implementations, the type can be based on whether the cell incorporates digital and/or analog elements, voltage level(s) used by the cell, dimensions of the cell, and/or whether the cell corresponds to high, low or standard voltage threshold (VT). Type can also be based on the type of transistors used in the cell, such as p-type, n-type, p-finFET, and n-finFET. As such, each type could be defined according to one or more characteristics of a cell. As shown in the schematic 100, the circuit cells 102 include four types:
A, B, C, and D, where each letter denotes one or more types of circuit cells discussed above. It should be noted that the number of types of circuit cells can be more or less than the four types shown in FIG. 1.

Figure 2:
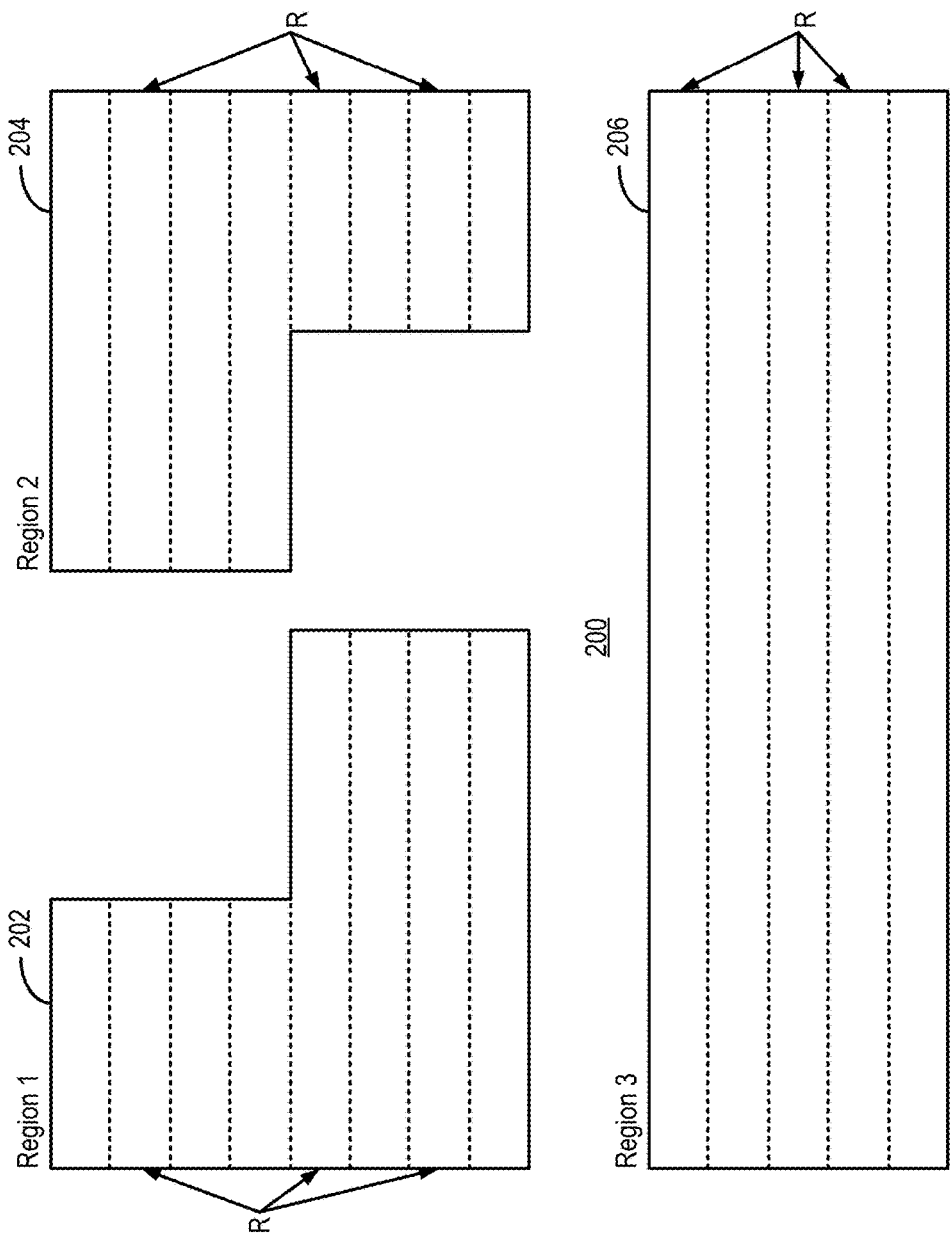
FIG. 2 illustrates a representation of a layout surface of a semiconductor chip according to the present embodiments.

As mentioned above, the circuit shown in the schematic 100 is transformed into a layout on a chip. FIG. 2 illustrates a representation of a layout surface 200 of a semiconductor chip. The layout surface 200 includes three regions: region-1 202, region-2 204, and region-3 206. While only three regions are shown in FIG. 2, this is merely for illustrative purposes and it is understood that the number of regions can be more or less than the three shown in FIG. 2. Each region has a rectilinear polygonal shape, that is any two edges of each region intersect at about 90 or about 270 degrees. However, in some embodiments, the regions can have non-rectilinear shapes, such as, for example, regular or irregular polygonal, circular, and elliptical.

Each region can define a constraint or a collection of constraints, which can limit the types of circuit cells that can be placed within the region. For example, in an illustrative embodiment, region-1 202 allows only type-A circuit cells; region-2 204 allows only types-A, B, and C circuit cells; and region-3 206 allows only types-B and C circuit cells. That is, layouts of only type-A circuit cells can be placed in region-1, layouts of only types A, B, and C can be placed in region-2 204, and layouts of only types-B and C can be placed in the region-3 206. Region constraints can be different in different implementations, with the ones shown in FIG. 2 being only an example. The regions can be located at different portions of a semiconductor chip surface, and there can be other regions between any two regions.

Each region can include a number of rows R. Each row R can define an area within which layouts of circuit cells can be placed. In some implementations, each row can include tracks of interconnects, such as, for example, power supply or ground interconnects. Circuit cell layouts can be placed on the appropriate row such that their respective supply or ground interconnects align with the appropriate interconnect in the row. Each row can have its own constraints, in addition to those imposed by the region in which they are enclosed. For example, a row can have an alignment constraint in which all circuit cells in the row are aligned to a bottom boundary or edge of the row. Circuit cells placed within a region may have to comply with the constraints of the region as well as the row in which the circuit cell is placed.

During the design flow of the circuit represented by the schematic 100 shown in FIG. 1, the circuit cells 102 in the schematic 100 are placed in on the layout surface 200. In some implementations, the positions of the layouts of the circuit cells 102 can be placed in any region on the layout surface 200 as far as the circuit cell satisfies the constraints of that region. For example, in one implementation, the circuit cells 102 of type-A may be placed in region-1 202 or region-2 204; the circuit cells of type-B can be placed in region-2 204 or in region-3 206; and the circuit cells 102 of type-C, similar to the circuit cells of type-B, can be placed in region-2 204 or in region-3 206. It is understood that "placing a circuit cell" in a region as used above, refers to placing a circuit layout corresponding to the circuit cell in the region. Once the circuit cells 102 are placed in the allowed regions, they can be arranged within the regions based on several techniques, which can consider various factors, such as size, orientation, power, and row constraints, to determine the position of each circuit cell 102 within the region. Such techniques are typically automated into placement tools or floor-planning tools that can be executed by the EDA tool. However, in some implementations, the use of these techniques can result in congested or overlapping circuit cell placements. Congested or overlapping circuit cell placement can adversely impact routing of interconnects between the circuit cells, and may affect the reliability of the circuit. In some other instances, with a large number of circuit cells, the EDA tool may take a long time to converge to a solution, or may provide solutions that may not be desired or optimal according to specific constraints.

In one example technique, as discussed in detail below, the circuit cells 102 are placed in the layout surface 200 such that their placement takes into consideration the relative positions of the circuit cells 102 on the schematic 100. In other words, the technique uses a place-like-schematic approach, in which the relative positions of the circuit cells 102 on the layout surface 200 can take into considerations, and as far as possible similar to, the relative positions of the circuit cells 102 on the schematic 100.

Figure 3:
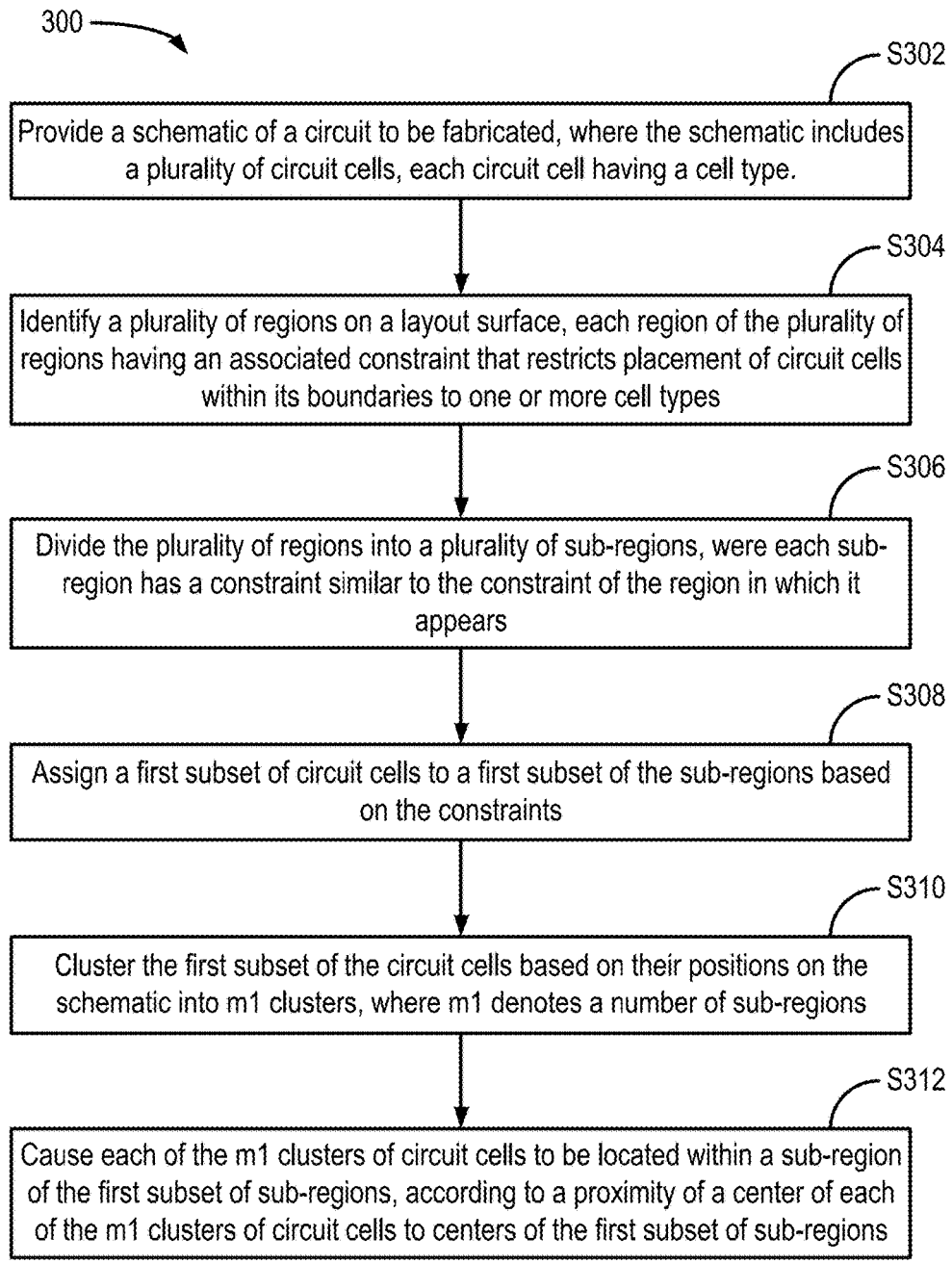
FIG. 3 shows a flow diagram illustrating an example process that can be used to place the circuit cells shown in a schematic to a layout surface according to the present embodiments.

FIG. 3 shows a flow diagram of an example process 300 that can be used to place for instance the circuit cells 102 shown in the schematic of FIG. 1 to the layout surface 200 shown in FIG. 2. The process 300, can be executed, for example, by an EDA tool. The process 300 includes, in some embodiments, providing a schematic of a circuit to be fabricated, where the schematic includes a plurality of circuit cells, each circuit cell having a cell-type (step S302). One example of this step is discussed above in relation to FIG. 1. As illustrated in FIG. 1, the schematic 100 includes a plurality of circuit cells 102. Each circuit cell 102 has a type. For example, six circuit cells are of type-A, five circuit cells are of type-B, and four circuit cells are of type-C.

Step S304 includes identifying a plurality of regions on a layout surface, where each region has a constraint that restricts the placement of circuit cells within its boundaries to one or more cell-types. One example of this process step is discussed above in relation to FIG. 2. As shown in FIG. 2, the layout surface 200 includes three regions: region-1 202, region-2 204, and region-3 206. Region-1 202 allows only type-A circuit cells; region-2 204 allows only types-A, B, and C circuit cells; and region-3 206 allows only types-B and C circuit cells.

Figure 4:
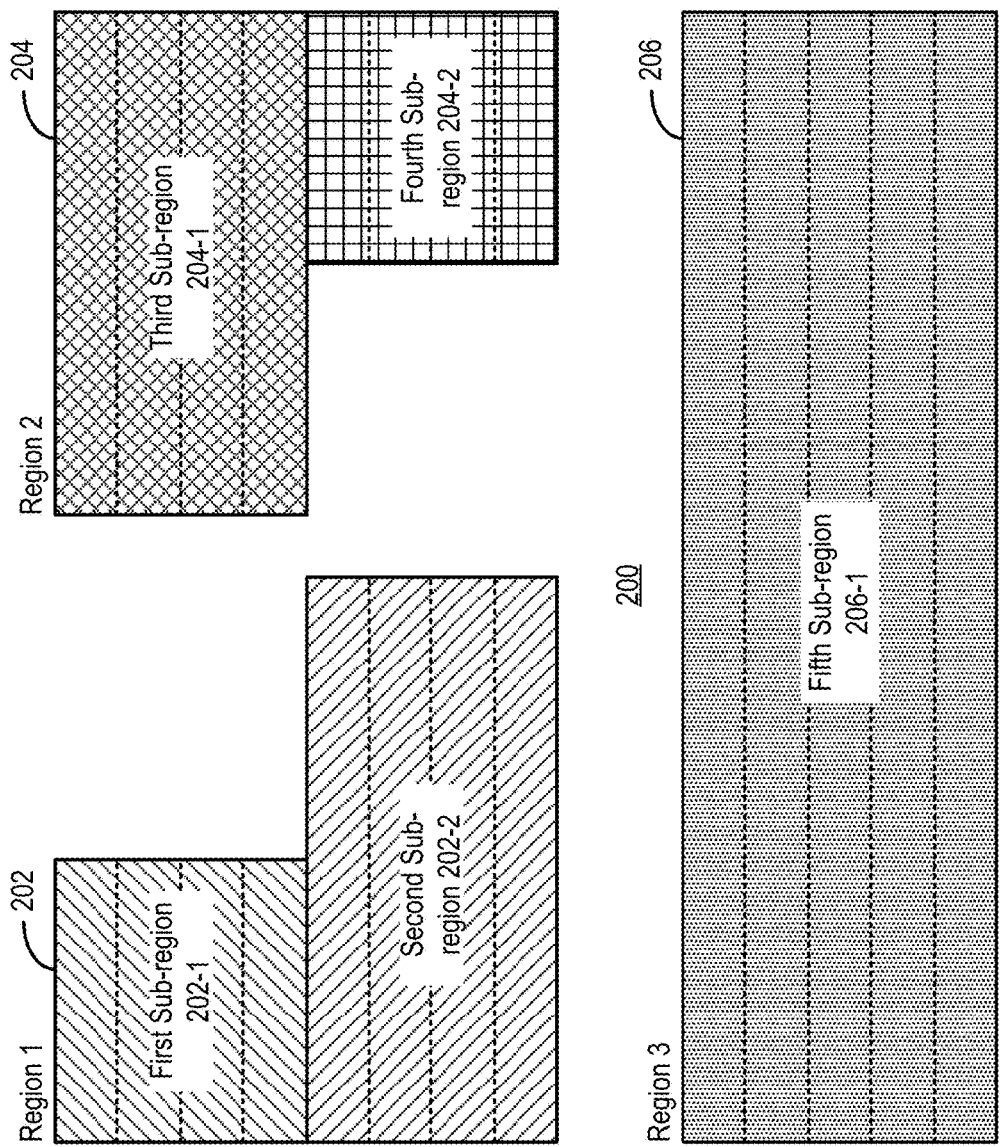
FIG. 4 illustrates the regions on a layout surface being divided into a number of sub-regions according to the present embodiment.

Step S306 includes dividing the plurality of regions into a plurality of sub-regions. One example of this process step is shown in FIG. 4, which illustrates the regions on the layout surface shown in FIG. 2 being divided into a number of sub-regions. Specifically, the region-1 202 is divided into a first sub-region 202-1 and a second sub-region 202-2; region-2 204 is divided into a third sub-region 204-1 and a fourth sub-region 204-2; and region-3 206 is divided into a single fifth sub-region 206-1, which includes the area of the region-3 206 in its entirety. The manner of dividing the regions illustrated in FIG. 4 is only an example. In some other implementations, each region can be divided into more than or less than the sub-regions shown in FIG. 4. Further, each of the sub-regions may have a substantially rectangular shape. However, in some other implementations, the shape of the sub-regions can be circular, elliptical, or polygonal (regular or irregular). In some implementations, the sub-regions within a region may not cover the entire area of the region. That is, a combined area of sub-regions within a region can be less than an area of the region. In some implementations, a boundary of a sub-region may coincide or overlap with a boundary of a row R within the region, such that a row R is either entirely within the sub-region or outside of the sub-region.

Each sub-region inherits the constraints of the region in which the sub-region is located. For example, the first sub-region 202-1 and a second sub-region 202-2 have the same constraints as the region-1 202, which allows placement of only type-A circuit cells. Similarly, the third sub-region 204-1 and the fourth sub-region 204-2 have the same constraints as the region-2 204, which allows placement of only type-A, B, and C circuit cells. Likewise, the fifth sub-region 206-1 has the same constraints as the region-3 206, which allows the placement of only type-B and C circuit cells.

Figure 5:
FIG. 5 shows an example assignment of a first subset of circuit cells to a first subset of the sub-regions based on constraints of the sub-regions according to the present embodiments.

Step S308 includes assigning a first subset of circuit cells to a first subset of the sub-regions based on the constraints of the sub-regions. FIG. 5 shows an example assignment 500. All circuit cells 102 having cell type-A are assigned to the first sub-region 202-1, the second sub-region 202-2, the third sub-region 204-1, and the fourth sub-region 204-2. All circuit cells 102 having cell types-B and C are assigned to the third sub-region 204-1, the fourth sub-region 204-2, and the fifth sub-region 206-1. The assignments are made based on the constraints of the sub-regions. For example, each of the first sub-region 202-1, the second sub-region 202-2, the third sub-region 204-1, and the fourth sub-region 204-2 allow the placement of the circuit cells 102 having the cell type-A. Similarly, each of the third sub-region 204-1, the fourth sub-region 204-2, and the fifth sub-region 206-1 allows the placement of circuit cells 102 having cell types-B and C. Of course, the assignment of the cell-types to the sub-regions can vary based on the constraints of the sub-regions. For example, if the region-1 202 was not to allow the placement of circuit cells of type-A, then the cell type-A would not be assigned to the first sub-region 202-1 and the second sub-region 202-2. Further, the number of cell types assigned to a group of sub-regions can be different. For example, the assignment can separately assign type-B and type-C circuit cells to the sub-regions. However, in some implementations, such as the one shown in FIG. 5, cell types resulting in the same sub-region assignments can be grouped together in a single subset of cell types. That is, cell type-B and cell type-C both result in the same sub-region assignments. Therefore, the cell type-B and the cell type-C can be grouped together in a single subset, which has the common sub-region assignment.

Figure 6:
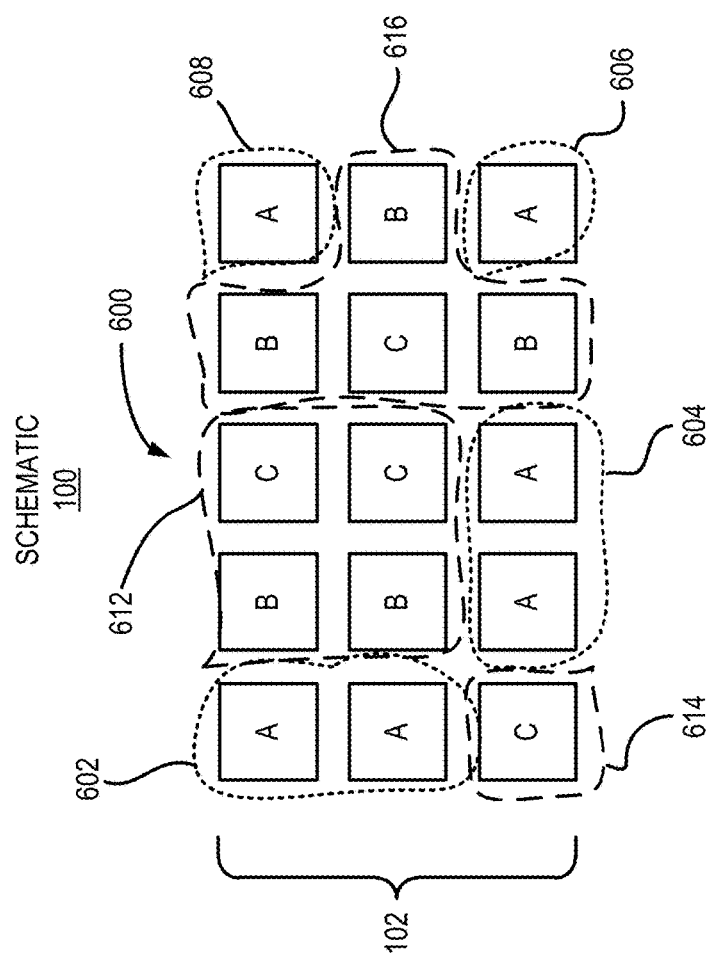
FIG. 6 illustrates an example clustering of circuit cells according to the present embodiment.

Referring again to FIG. 3, step S310 includes clustering the first subset of the circuit cells based on their positions on the schematic into m1 clusters, where m1 denotes a number of sub-regions. FIG. 6 illustrates an example clustering 600 of circuit cells 102. Circuit cells 102 of type-A are clustered into four clusters: a first type-A cluster 602, a second type-A cluster 604, a third type-A cluster 606 and a fourth type-A cluster 608. Circuit cells 102 of type-B and type-C are clustered into three clusters: a first type-BC cluster 612, a second type-BC cluster 614, and a third type-BC cluster 614. The first type-A cluster 602 includes two type-A circuit cells 102, the second type-A cluster 604 also includes two type-A circuit cells 102, and the third type-A cluster 606 includes one type-A circuit cell 102. The first type-BC cluster 612 includes four type-B or type-C circuit cells 102, the second type-BC cluster 614 includes one type-C circuit cell 102, and the third type-BC cluster 616 includes two type-B and two type-C circuit cells 102. In FIG. 6, the first subset of circuit cells can be the type-A circuit cells 102, and m1 can be equal to 4. Alternatively, the first subset of circuit cells can be the subset of circuit cells of type-B or type-C, and m1 can be equal to 3.

In some implementations, the number of clusters formed can be different from that shown in FIG. 6. For example, the number of clusters formed from the type-A circuit cells 102 can be less than or more than the four clusters shown in FIG.

6. In some implementations, the number of clusters can be equal to the number of sub-regions that can allow the placement of the subset of circuit cells. For example, as shown in FIG. 5, four sub-regions (the first sub-region 202-1, the second sub-region 202-2, the third sub-region 204-1, and the fourth sub-region 204-2) allow the placement of the subset of circuit cells having cell type-A. That subset of circuit cells may be clustered into four clusters. Similarly, three sub-regions (the third sub-region 204-1, the fourth sub-region 204-2, and the fifth sub-region 206-1) allow the placement of the subset of circuit cells of cell type-B and C. That subset can be clustered into three clusters.

The clustering of the circuit cells can be based on the locations or positions of the circuit cells on the schematic 100. A clustering algorithm can be used to form clusters of circuit cells. For example, in some implementations, a k-means clustering algorithm can be used to form the clusters, where k denotes the number of clusters to be formed. In some such implementations, the value of k can be equal to the number of sub-regions assigned to the set of circuit cells. For example, as shown in FIG. 5, the subset of circuit cells having type-A circuit cells are assigned to four sub-regions. Therefore, the value of k can be equal to 4. However, the value of k can be selected to be less than or greater than 4. The subset of circuit cells having type-B and C also can be similarly clustered. For example, the value of k can be selected to be equal to 3. The k-means clustering algorithm can use centroids of each of the circuit cells 102 to form the clusters.

Clustering algorithms and methods other than the k-means clustering algorithm also can be used. For example, the clustering algorithm or methods such as Bradley-Fayyad-Reina and expectation-maximization (EM) algorithm, can be used.

Referring to FIG. 3, step S312 includes causing each of the m1 clusters of circuit cells to be located within a sub-region of the first subset of sub-regions, based on the proximity of a center of each of the m1 clusters of the circuit cells to the centers of the first subset of sub-regions. Referring to FIG. 6, and considering the subset of circuit cells of type-A as the first subset of the circuit cells, the four clusters: the first type-A cluster 602, the second type-A cluster 604, the third type-A cluster 606, and the fourth type-A cluster 608 are positioned within one or more of the four sub-regions: the first sub-region 202-1, the second sub-region 202-2, the third sub-region 204-1, and the fourth sub-region 204-2. The placement of these circuit cells 102 can be based, in part, on the locations of the centers of each of the clusters and the centers of each of the sub-regions. It should be noted that "center" can refer to a geometric center or a centroid. The EDA tool determines the center of each of the four clusters and each of the four sub-regions. Based on the proximity of the centers of the four clusters to the centers of the four regions, each cluster can be placed on one or more regions. For example, a cluster can be placed in a sub-region whose center is closest to the center of the cluster. For example, in one example instance, the first type-A cluster 602 can be placed in the first sub-region 202-1, the second type-A cluster 604 can be placed in the second sub-region 202-2, the third type-A cluster 606 can be placed in the third sub-region 204-1, and the fourth type-A cluster 608 can be placed in the fourth sub-region 204-2. In placing a cluster within a sub-region, the relative positions of the clusters may change, but the relative positions of the circuit cells 102 within each clusters is maintained.

In some implementations, a coordinate system of the schematic 100 may have to be transformed or translated into the coordinate system of the layout 200 to determine the placement of the clusters in the appropriate sub-regions. For example, schematics can be made of symbols having arbitrary sizes and boundaries. Generally, a size of a schematic does not have a strict relationship with the size of a resulting layout. That is, the dimensions and/or spatial distribution/representation of the symbols of the circuit cells 102 as they appear on the schematic 100 may not correspond to the dimensions of the dimensions of the layout of the circuit cell 102 on the layout or on the semiconductor chip. However, assuming that the actual dimensions of a layout circuit cell of each circuit cell 102 in the schematic is known, the size of each circuit cell 102 on the schematic can be represented by the size of the corresponding layout circuit cell. Thus, by representing the sizes or boundaries of each of the circuit cells 102 by the sizes or boundaries of their corresponding layout circuit cells, the dimensions of the circuit cells 102 on the schematic can be represented in the same coordinate system used to represent the sub-regions on the layout 200. In some instances, the schematics editor can determine the dimensions of the layouts of circuit cells 102 in the schematic 100 from the information in the circuit cell library. In some other implementations, the schematic editor can estimate the dimensions of the layout of a circuit cell 102 on the schematic based on a netlist information of the circuit cell and sizes of the constituent components in the fabrication technology used. By having the clusters (and the constituent circuit cells) in the schematic and the sub-regions in the layout expressed in the same coordinate system, the placement of the clusters based on the centers of the clusters and the centers of the sub-regions can be easily carried out.

Figure 7:
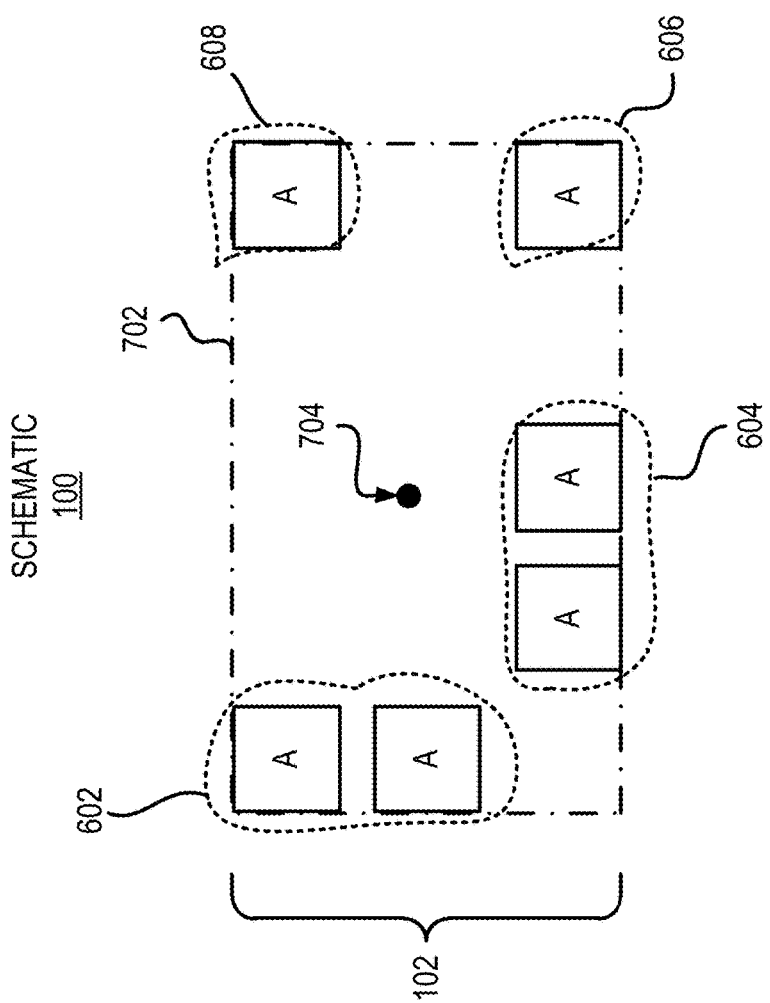
FIG. 7 illustrates a bounding box around circuit cells on a schematic according to the present embodiment.
Figure 8:
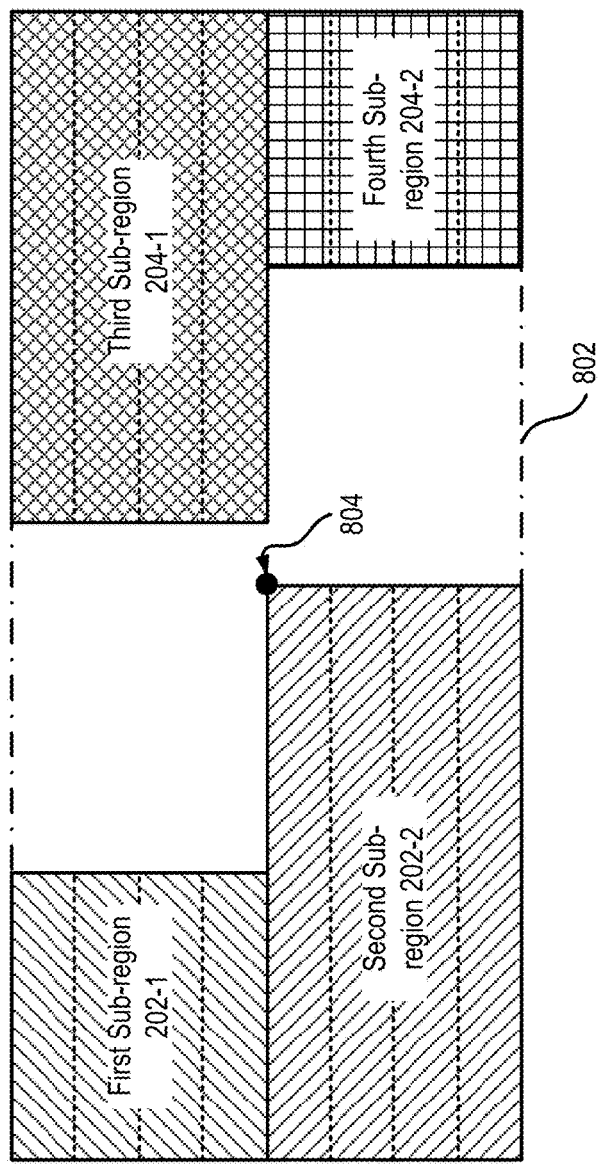
FIG. 8 illustrates a bounding box around sub-regions on a layout according to the present embodiment.

In some instances, the first subset of circuit cells can be mapped to the first subset of sub-regions using a bounding box method, which can be an optional step or phase. For example, FIG. 7 shows the four clusters of type-A circuit cells. A bounding box 702 can be defined around the circuit cells such that the perimeter of the bounding box 702 encloses all of the circuit cells 102. In some instances, the bounding box 702 can be a smallest bounding box that can contain all the circuit cells within its perimeter. A bounding box center 704 also can be defined, where the bounding box center 704 represents a geometric center of the bounding box 702. Similarly, a bounding box can be defined around the regions to which the first set of clusters are to be placed in. For example, FIG. 8 illustrates a bounding box 802 around the first sub-region 202-1, the second sub-region 202-2, the third sub-region 204-1, and the fourth sub-region 204-2. A bounding box center 804 that represents a geometric center of the bounding box 804 can also be defined. To begin the placement of the clusters on the layout, the first subset of circuit cells can mapped to the first subset of sub-regions such that the bounding box center 704 coincides with the bounding box center 804.

Figure 9:
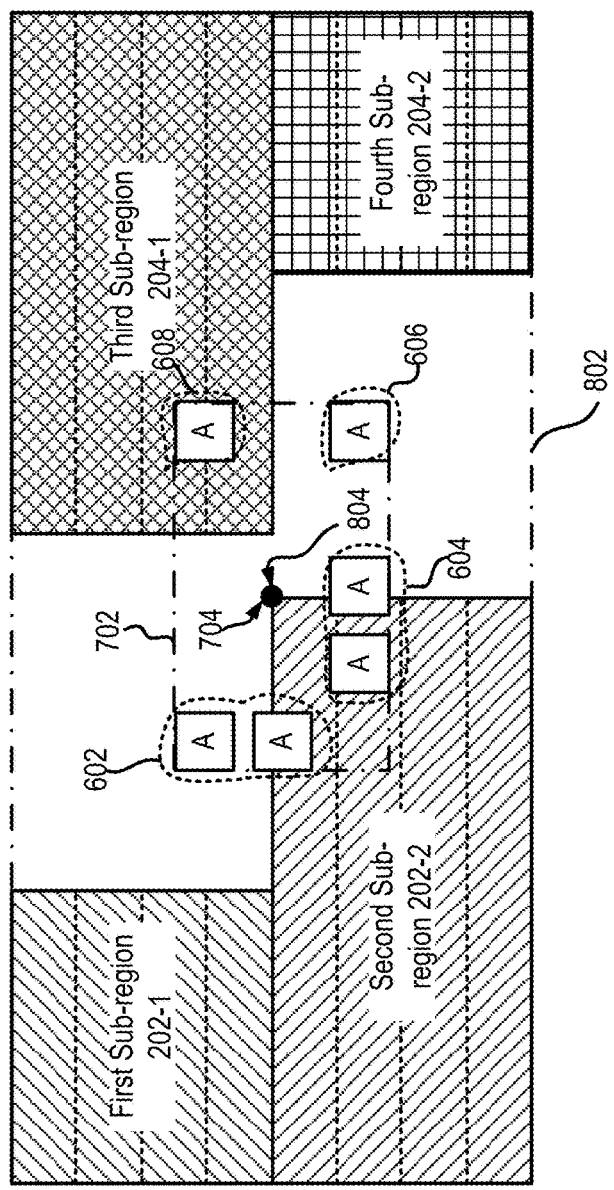
FIG. 9 illustrates an example mapping of a first set of clusters to a first set of sub-regions according to the present embodiment.

FIG. 9 illustrates an example mapping of the first set of clusters to the first set of sub-regions, where the bounding box center 704 of the bounding box 702 coincides with the bounding box center 804 of the bounding box 802. After this initial mapping for instance, the clusters can be placed based on the proximity of the centers of the clusters to the centers of the sub-regions. For example, both the first type-A cluster 602 and the second type-A cluster 604 may have centers that are closest to the center of the second sub-region 202-2. As a result, both the first type-A cluster 602 and the second type-A cluster 604 may be placed in the second sub-region 202-2. The center of the fourth type-A cluster 608 may be closest to the center of the third sub-region 204-1 and the center of the third type-A cluster 606 may be closest to the fourth sub-region 204-2. Thus, the fourth type-A cluster 608 may be placed into the third sub-region 204-1 and the third type-A cluster 606 may be placed in the fourth sub-region 204-2.

While the bounding boxes 702 and 802 shown in FIGS. 7 and 8 are rectangles, it is understood that the bounding boxes of other shapes also can be used. For example, bounding boxes having circular, elliptical, and polygonal (regular or irregular) shapes also can be used. Further, the mapping the bounding box of the first subset of circuit cells to the first subset of sub-regions, points other than the centers of the bounding box can be used as reference points. For example, instead of the centers, a corner or an edge of one bounding box can be made to coincide with the corresponding corner or edge of the other bounding box.

Similar techniques can be used for the initial placement of the second subset of circuit cells into the second subset of sub-regions. That is, the initial placement of the first type-BC cluster 612, the second type-BC cluster 614, and the third type-BC cluster 614 to one or more of the third sub-region 204-1, the fourth sub-region 204-2, and the fifth sub-region 206-1 can be carried out in a manner similar to that discussed above in placing the first subset of circuit cells into the first subset of sub-regions.

In placing the clusters of circuit cells within each sub-region, each circuit cell can be placed within a row R of the sub-region. As mentioned above, each row R may have constraints in addition to the constraints of the region in which the rows R lie. Therefore, the position of the cluster of circuit cells within the sub-region may be further determined by the rows in which the circuit cells can be accommodated.

In some instances, the EDA tool may not be able to place the circuit cells of a cluster within the boundaries of the selected sub-region according to the spatial distribution of the cluster. In some such instances, the EDA tool may scale the cluster by scaling the space between circuit cells. For example, the EDA tool can, if possible, bring two neighboring circuit cells in a cluster closer to each other while still maintaining their relative positions. By scaling the space between two neighboring circuit cells, the size of the cluster including the circuit cells can be reduced, thereby increasing the likelihood of the cluster being able to fit within the boundaries of the sub-region. Scaling a cluster can include translating the positions of the circuit cell within the cluster. In some implementations, the translation of the positions of the circuit cells can be carried out while maintaining their relative directionality.

The EDA tool can use the initial placement of the circuit cells into the regions on the layout to carry out further placement legalization and/or optimization. In some implementations, placement legalization can include resolving overlaps in circuit cell placements. The EDA tool can determine if the boundaries of two or more circuit cells are overlapping as a result of the initial placement. If overlap is detected, the EDA tool can move one or more circuit cells such that the overlap is removed. The EDA tool also can run additional placement optimizations that can take into considerations the timing constraints of the circuit for instance. For example, the EDA tool may reposition one or more circuit cells such that a length of an interconnect between the two circuit cells is reduced to satisfy timing constraints. The EDA tool may carry out additional legalizations and optimizations as well.

Providing the initial placement of the circuit cells on the layout based on their relative positions in the schematic, allows the EDA tool a good starting point from which further legalization and optimization can be carried out. This can reduce the risk of congested placement of circuit cells or the risk of the EDA tool taking a long time to converge to a placement solution.

Figure 10:
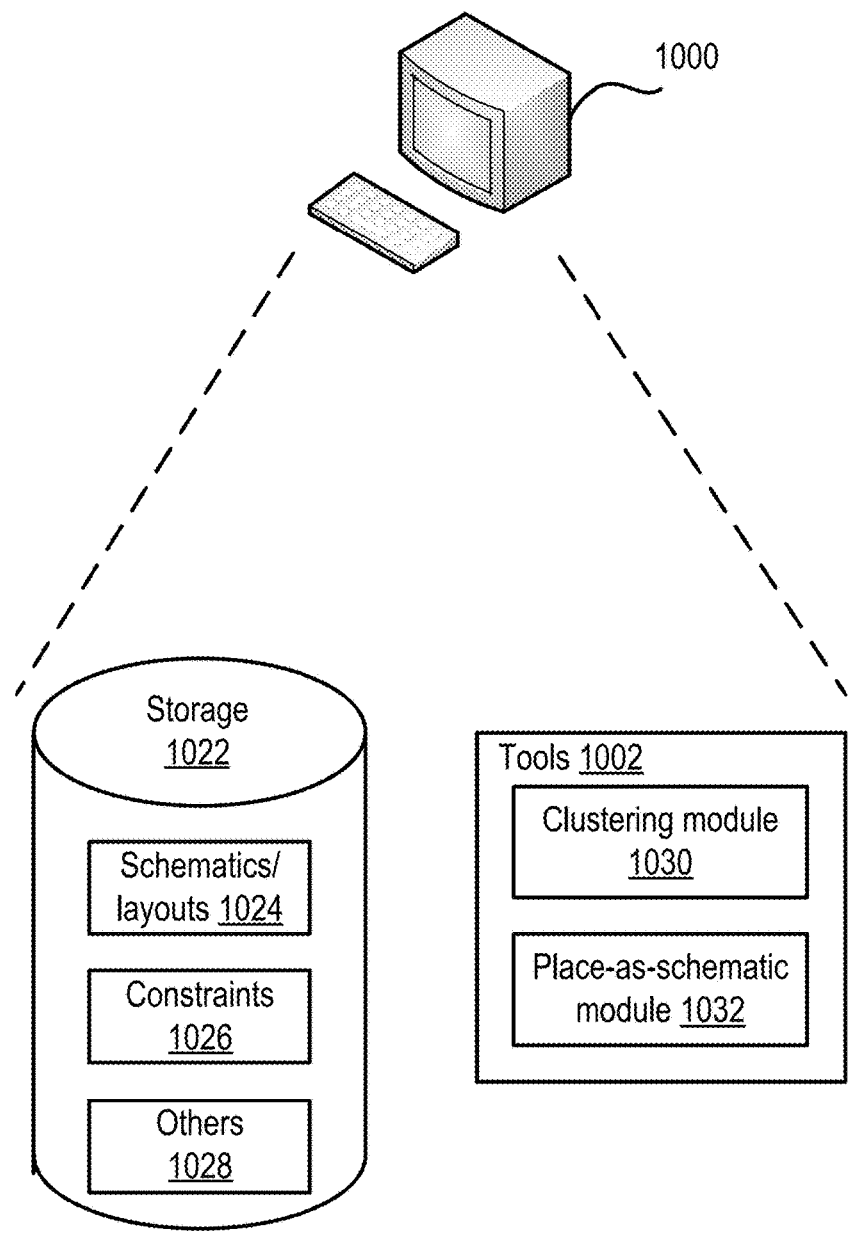
FIG. 10 is a functional block diagram illustrating an example system according to the present embodiments.

FIG. 10 is a functional block diagram of an example system for using place-as-schematic circuit cell placement in an integrated circuit design according to the present embodiments. In some embodiments, the system 1000 can be one or more computers that are loaded with software (e.g., EDA tools) and/or customized to include hardware for interactively and/or automatically implementing designs of integrated circuits (e.g., ASICs, SOCs, full custom digital ICs). In some embodiments, the one or more computing systems 1000 comprise various components not shown such as processor(s) or processor core(s), memory, disks, etc. The software and/or custom hardware may include interactive or automated modules such as a placer, a routing engine, a layout editor, a wire editor, a design rule checker, a verification engine, a module generator, and/or a floor-planner, as will be appreciated by those skilled in the art.

In one or more embodiments, the computing system 1000 may further write to and read from a local or remote volatile or non-volatile computer accessible storage 1022 that stores thereon data or information such as, but not limited to, one or more databases such as post-placement layouts, schematic design database(s) or physical design database(s) 1024 (e.g., GDS II or OASIS data, etc.), libraries, rule decks, constraints (e.g., track specifications, minimum spacing, pitch/width requirements, widths, BCB rules), etc. 1026, and/or other information or data 1028 (e.g., trim shape locations) that may be required to support the methodology of the present embodiments. According to certain aspects, design rules in storage 1026 are extendable or changeable (e.g., via APIs and the like) without changing other components or data in system 1000.

In some embodiments, the one or more computing systems are implemented in a "cloud" configuration and/or a client/server configuration. For example, one or more server computers may be loaded with application software (e.g., a router and/or other EDA tool) for implementing some or all of the methodology of the present embodiments, and one or more client computers can communicate with the server computer(s) via a network to perform some or all of the methodology of the embodiments for a particular design.

In some embodiments, the one or more computing systems 1000 may, by various standalone software, hardware modules or combinations thereof 1002 (e.g., EDA tool), include a clustering module 1030 that identifies clusters of circuit cells in a schematic based on the types of the circuit cells. Modules 1002 further includes a place-as-schematic module 1032 for determining regions within a layout that can accommodate clusters of circuit cells based on the constraints of the regions. Further, the place-as-schematic module 1032 can cause an m1 clusters of circuit cells to be located in one or more sub-regions of a subset of sub-regions identified in the layout. It should be noted that any or all of modules 1030 and 1032 may be implemented by adapting or communicating with certain pre-existing modules (e.g., placer, router, layout editor, design rule checker) as may be required to implement a methodology to implement design rule correct IC designs according to the present embodiments and as described above. Those skilled in the art will be able to understand how to implement various examples of such modules after being taught by the present disclosure.

Although the present embodiments have been particularly described with reference to preferred ones thereof, it should be readily apparent to those of ordinary skill in the art that changes and modifications in the form and details may be made without departing from the spirit and scope of the present disclosure. It is intended that the appended claims encompass such changes and modifications.

What is claimed is:

1. A method for implementing a design for an integrated circuit, comprising:
   providing a schematic of a circuit having a plurality of circuit cells, each of the plurality of circuit cells having a cell-type;
   identifying a plurality of sub-regions on a semiconductor chip, each sub-region having an associated constraint that restricts placement of circuit cells within its boundaries to one or more cell-types based at least on physical or electrical properties of the circuit cells;
   assigning a first subset of circuit cells, from the plurality of circuit cells, to a first subset of the sub-regions according to the constraint associated with each sub-region in the first subset of the sub-regions;
   clustering the first subset of circuit cells based on their positions on the schematic into m1 clusters of circuit cells, wherein m1 denotes a number of sub-regions in the first subset of the sub-regions; and
   causing each of the m1 clusters of circuit cells to be located within one or more sub-regions of the first subset of the sub-regions, according to proximity of a center of each of the m1 clusters to centers of sub-regions of the first subset of the sub-regions.

2. The method of claim 1, further comprising:
   dividing a plurality of regions into the plurality of sub-regions, each sub-region having the constraint similar to a constraint of the region in which it appears, wherein each region of the plurality of regions is a polygon, an angle between any two edges of the polygon being 90 or 270 degrees.

3. The method of claim 1, wherein at least one sub-region of the plurality of sub-regions has a rectangular shape.

4. The method of claim 1, wherein each sub-region includes a plurality of rows, wherein each row of the plurality of rows accommodates circuit cells of one or more predefined cell-types.

5. The method of claim 1, wherein causing each of the m1 clusters of circuit cells to be located within a sub-region of the first subset of sub-regions includes scaling at least one of the m1 clusters of circuit cells.

6. The method of claim 1, wherein causing each of the m1 clusters of circuit cells to be located within a sub-region of the first subset of sub-regions includes determining physical dimensions of each circuit cell of the m1 clusters of circuit cells.

7. The method of claim 1, further comprising:
   assigning a second subset of circuit cells, from the plurality of circuit cells, to a second subset of the sub-regions according to the constraint associated with each sub-region in the second subset of the sub-regions;
   clustering the second subset of circuit cells into m2 clusters of circuit cells, wherein m2 denotes a number of sub-regions in the second subset of sub-regions; and
   causing each of the m2 clusters of circuit cells to be located within at least one sub-region of the second subset of sub-regions, according to proximity of a center of each of the m2 clusters to centers of sub-regions of the second subset of sub-regions.

8. A non-transitory computer readable storage medium having instructions stored thereon which, when executed by a computer, cause the computer to execute a method for implementing a design for an integrated circuit, the method comprising:
   providing a schematic of a circuit having a plurality of circuit cells, each of the plurality of circuit cells having a cell-type;
   identifying a plurality of sub-regions on a semiconductor chip, each sub-region having an associated constraint that restricts placement of circuit cells within its boundaries to one or more cell-types based at least on physical or electrical properties of the circuit cells;
   assigning a first subset of circuit cells, from the plurality of circuit cells, to a first subset of the sub-regions according to the constraint associated with each sub-region in the first subset of the sub-regions;
   clustering the first subset of circuit cells based on their positions on the schematic into m1 clusters of circuit cells, wherein m1 denotes a number of sub-regions in the first subset of the sub-regions; and
   causing each of the m1 clusters of circuit cells to be located within one or more sub-regions of the first subset of the sub-regions, according to proximity of a center of each of the m1 clusters to centers of sub-regions of the first subset of the sub-regions.

9. The non-transitory computer readable storage medium according to claim 8, wherein the method further comprises:
   dividing a plurality of regions into the plurality of sub-regions, each sub-region having the constraint similar to a constraint of the region in which it appears, wherein each region of the plurality of regions is a polygon, an angle between any two edges of the polygon being 90 or 270 degrees.

10. The non-transitory computer readable storage medium according to claim 8, wherein at least one sub-region of the plurality of sub-regions has a rectangular shape.

11. The non-transitory computer readable storage medium according to claim 8, wherein each sub-region includes a plurality of rows, wherein each row of the plurality of rows accommodates circuit cells of one or more specified cell-types.

12. The non-transitory computer readable storage medium according to claim 8, wherein causing each of the m1 clusters of circuit cells to be located within a sub-region of the first subset of sub-regions includes scaling at least one of the m1 clusters of circuit cells.

13. The non-transitory computer readable storage medium according to claim 8, wherein causing each of the m1 clusters of circuit cells to be located within a sub-region of the first subset of sub-regions includes determining physical dimensions of each circuit cell of the m1 clusters of circuit cells.

14. The non-transitory computer readable storage medium according to claim 8, the method further comprising:
   assigning a second subset of circuit cells, from the plurality of circuit cells, to a second subset of the sub-regions according to the constraint associated with each sub-region in the second subset of the sub-regions;
   clustering the second subset of circuit cells into m2 clusters of circuit cells, wherein m2 denotes a number of sub-regions in the second subset of sub-regions; and
   causing each of the m2 clusters of circuit cells to be located within at least one sub-region of the second subset of sub-regions, according to proximity of a center of each of the m2 clusters to centers of sub-regions of the second subset of sub-regions.

15. A system for implementing a design of an integrated circuit, comprising one or more processors, the one or more processors configured to:
provide a schematic of a circuit having a plurality of circuit cells, each of the plurality of circuit cells having a cell-type;
identify a plurality of sub-regions on a semiconductor chip, each sub-region having an associated constraint that restricts placement of circuit cells within its boundaries to one or more cell-types based at least on physical or electrical properties of the circuit cells;
assign a first subset of circuit cells, from the plurality of circuit cells, to a first subset of the sub-regions according to the constraint associated with each sub-region in the first subset of the sub-regions;
cluster the first subset of circuit cells based on their positions on the schematic into m1 clusters of circuit cells, wherein m1 denotes a number of sub-regions in the first subset of the sub-regions; and
cause each of the m1 clusters of circuit cells to be located within one or more sub-regions of the first subset of the sub-regions, according to proximity of a center of each of the m1 clusters to centers of sub-regions of the first subset of the sub-regions.

16. The system of claim 15, wherein the one or more processors are configured to:
divide a plurality of regions into the plurality of sub-regions, each sub-region having the constraint similar to a constraint of the region in which it appears, wherein each region of the plurality of regions is a polygon, an angle between any two edges of the polygon being 90 or 270 degrees.

17. The system of claim 16, wherein at least one sub-region of the plurality of sub-regions has a rectangular shape.

18. The system of claim 15, wherein each sub-region includes a plurality of rows, wherein each row of the plurality of rows accommodates circuit cells of one or more specified cell-types.

19. The system of claim 15, wherein the one or more processors are further configured to cause each of the m1 clusters of circuit cells to be located within a sub-region of the first subset of sub-regions by scaling at least one of the m1 clusters of circuit cells.

20. The method of claim 15, wherein the one or more processors are further configured to cause each of the m1 clusters of circuit cells to be located within a sub-region of the first subset of sub-regions by determining physical dimensions of each circuit cell of the m1 clusters of circuit cells.

* * * * *